United States Patent [19]

Lee et al.

[11] Patent Number: 4,786,586
[45] Date of Patent: Nov. 22, 1988

[54] RADIATION CURABLE COATING FOR PHOTOGRAPHIC LAMINATE

[75] Inventors: San A. Lee, Crystal Lake; Stuart M. Ellerstein, Barrington, both of Ill.

[73] Assignee: Morton Thiokol, Inc., Chicago, Ill.

[21] Appl. No.: 14,160

[22] Filed: Feb. 12, 1987

Related U.S. Application Data

[60] Division of Ser. No. 763,755, Aug. 6, 1985, abandoned, which is a continuation of Ser. No. 439,521, Nov. 5, 1982, abandoned.

[51] Int. Cl.$^4$ .......................... C08F 2/50; C08F 20/36; C08F 20/18; G03C 7/14
[52] U.S. Cl. ..................................... 430/532; 430/536; 430/961; 522/21; 522/42; 522/96; 522/182
[58] Field of Search ........................ 430/532, 536, 961

[56] References Cited

U.S. PATENT DOCUMENTS

| 3,678,014 | 7/1972 | Suzuki . | |
|---|---|---|---|
| 3,783,151 | 1/1974 | Carlick et al. . | |
| 3,850,770 | 11/1974 | Juna et al. . | |
| 3,852,787 | 12/1974 | Nims et al. . | |
| 3,864,133 | 2/1975 | Hisamatsu et al. . | |
| 3,872,151 | 3/1975 | Kehr et al. . | |
| 3,891,523 | 6/1975 | Hisamatsu et al. . | |
| 3,907,865 | 9/1975 | Miyata et al. . | |
| 3,924,023 | 12/1975 | Boranian et al. . | |
| 4,020,125 | 4/1977 | Suzuki et al. | 260/859 R |
| 4,112,017 | 9/1978 | Howard . | |
| 4,120,721 | 10/1978 | Ketley . | |
| 4,129,667 | 12/1978 | Lorenz et al. | 204/159.16 |
| 4,135,007 | 1/1979 | Lorenz et al. | 204/159.16 |
| 4,137,081 | 1/1979 | Pohl | 204/159.16 |
| 4,192,684 | 3/1980 | Gensho et al. . | |
| 4,204,010 | 5/1980 | Kramm . | |
| 4,333,998 | 6/1982 | Leszyk . | |
| 4,353,980 | 10/1982 | Helling | 430/532 |
| 4,477,548 | 10/1984 | Harasta | 430/532 |

FOREIGN PATENT DOCUMENTS

| 516747 | 1/1979 | Australia . |
| 518456 | 1/1979 | Australia . |
| 53-35481 | 10/1978 | Japan . |
| 1253757 | 11/1971 | United Kingdom . |
| 1531351 | 11/1978 | United Kingdom . |
| 2070634 | 9/1981 | United Kingdom . |
| 2085023 | 4/1982 | United Kingdom . |

Primary Examiner—John C. Bleutge
Assistant Examiner—Arthur H. Koeckert
Attorney, Agent, or Firm—George Wheeler; Gerald K. White

[57] ABSTRACT

Compositions comprising an impermeable acrylate-terminated oligomer, at least one reactive diluent, and alpha-hydroxycyclohexylphenyl ketone, diethoxyacetophenone, 1-(4-dodecylphenyl)-2-hydroxy-2-methylpropan-1-one, or 2-hydroxy-2-methyl-1-phenylpropan-1-one as a photoinitiator, are disclosed. These compositions have utility in optical coatings.

5 Claims, No Drawings

RADIATION CURABLE COATING FOR PHOTOGRAPHIC LAMINATE

CROSS-REFERENCE TO RELATED APPLICATIONS

This application is a division of U.S. Ser. No. 763,755, filed Aug. 6, 1985, now abandoned, which is a continuation of U.S. Ser. No. 439,521, filed Nov. 5, 1982, now abandoned.

BACKGROUND OF THE INVENTION

A. Field of the Invention

This invention relates to ultraviolet radiation curable compositions suitable for use as optical coatings for use in photographic films.

Manufacturers of photographic films have been attempting to perfect three-dimensional-effect color films for some time. One approach currently under investigation is to deposit a clear, lenticulated optical coating onto conventional photographic print material. The optical coating is responsible for the three dimensional effect and is usually composed of a cross-linked, ultraviolet-radiation-cured acrylic polymer supported by a clear plastic base such as cellulose triacetate, polypropylene, or polyester. The optical coating is typically 8–11 mils (0.008–0.011 inch) thick. Lenticulated optical coatings are described in J. Nims et al, "Three Dimensional Pictures And Method Of Composing Them," U.S. Pat. No. 3,852,787 (Dec. 3, 1974).

An optical coating should possess several characteristics; foremost among them is optical clarity. The optical coating must not be susceptible to yellowing or other discoloration prior to, during, and after exposure and developing of the color print material underlying the optical coating.

In addition to optical clarity, the optical coating must be sufficiently flexible so as not to crack when the film is bent in half.

The physical characteristics of the optical coating are highly dependent upon the choice of acrylate-terminated oligomers employed in the manufacture of the optical coating. In addition to providing a cured acrylic optical coating which satisfies the requirements discussed above, the uncured optical coating composition should possess a rapid cure rate, thereby allowing processing speeds of at least 15 feet per minute and preferably 30–60 feet per minute.

Typically, acrylate-terminated oligomers which possess polyester or polyether backbones have been employed in the manufacture of optical coatings. Polyester-based acrylic coatings display poor hydrolytic stability. Conventional water-based photographic developers can easily penetrate polyester-based acrylic optical coatings, thereby causing severe yellowing of the optical coating. Polyether-based acrylic coatings suffer from poor oxidative stability, and are also permeable to photographic developers.

In copending patent application Ser. No. 419,676, filed Sept. 20, 1982, now abandoned, we disclose optical coating compositions which employ polyurethane-based acrylate-terminated oligomers.

B. Description of the Prior Art

H. Hisamatsu et al, "Photopolymerizable Isocyanate-Containing Prepolymers," U.S. Pat. No. 3,891,523 (June 24, 1975) discloses UV curable, acrylate-terminated polyurethane prepolymers which have a free isocyanate content of from 0.3 to 15 percent based on the total weight of the prepolymer and a cure initiator. The excess isocyanate groups are stated to impart superior adhesion to a substrate.

N. Miyata et al, "Photopolymerizable Vinylurethane Monomer," U.S. Pat. No. 3,907,865 (Sept. 23, 1975) discloses acrylate-terminated polyurethane oligomers which are highly UV curable and which, upon curing, form a non-yellowing acrylic film. The reference requires the use of xylylene diisocyanate in the preparation of its acrylate-terminated polyurethane oligomer.

D. Lorenz et al, "Radiation Curable Coating Composition Comprising An Acryl Urethane Oligomer And An Ultra-Violet Absorber," U.S. Pat. No. 4,129,667 (Dec. 12, 1978) discloses an acrylate-terminated, polyether or polyester-based polyurethane oligomer which is employed in combination with an acrylic ultraviolet radiation absorber.

D. Lorenz et al, "Radiation Curable Coating Composition Comprising An Acryl Urethane Oligomer And An Ultra-Violet Absorber," U.S. Pat. No. 4,135,007 (Jan. 17, 1979) discloses a radiation curable coating composition comprising an acrylate-terminated, polyether or polyester-based polyurethane oligomer and a benzylidene acid ester.

H. Suzuki et al, "Thermosetting Resins," U.S. Pat. No. 4,020,125 (Apr. 26, 1977) discloses an acrylate-terminated hydrogenated polybutadiene polymer which may be cured by exposure to electron beam radiation. The thermoset resin so produced has utility in electrical components.

SUMMARY OF THE INVENTION

The applicants' invention is a composition of matter comprising:

(i) from 45 to 80 percent, based upon the total weight of the composition, of an oligomer of the formula

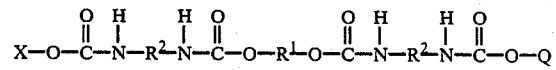

wherein $R^1$ is a linear or branched hydrocarbon of from 1,000 to 4,000 molecular weight, $R^2$ is a linear, branched or cyclic alkyl of from six to twenty carbon atoms, X and Q are independently either (a) a radical of the formula

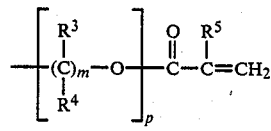

wherein $R^3$, $R^4$ and $R^5$ are independently selected from the group consisting of hydrogen, methyl, ethyl or propyl, m is an integer from 1 to 10, and p is either zero or one, or (b) a saturated alkyl of from nine to twenty carbon atoms with the proviso that said oligomer must possess at least one acrylate or methacrylate terminal group;

(ii) from 20 to 50 percent, based on total weight of the composition, of an acrylate or methacrylate terminated reactive diluent of from 11 to 22 carbon atoms;

(iii) from 0.5 to 5 percent, based on total weight of the composition, of a photoinitiator selected from the group comprising alpha-hydroxycyclohexylphenyl ketone diethoxyacetophenone,1-(4-dodecylphenyl)-2-hydroxy-2-methylpropan-1-one, 2-hydroxy-2-methyl-1-phenyl-propan-1-one and mixtures thereof.

When cured, the composition described above solidifies into a dry, water-impermeable film which is resistant to yellowing and suitable for use in a lenticulated optical coating.

DETAILED DESCRIPTION OF THE INVENTION

The applicants have discovered that a composition comprising an acrylate-terminated oligomer conforming to formula I above, at least one reactive diluent, and a specific photoinitiator satisfies the rigorous criteria required of optical coatings.

A. THE ACRYLATE-TERMINATED OLIGOMER

The acrylate-terminated oligomer is composed of an organic polymeric backbone which has been end-capped with a diisocyanate which is itself then further reacted with an acrylation agent.

1. The Organic Polymeric Backbone

The organic polymeric backbone which is employed in the applicants' invention is formed from a linear or branched hydrocarbon of from 1,000 to 4,000 molecular weight. By "hydrocarbon" it is meant a non-aromatic compound containing a majority of methylene groups ($-CH_2-$) and which may contain both internal unsaturation ($-CH=CH-$) and pendant unsaturation

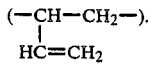

Fully saturated hydrocarbons are preferred because the long-term flexibility of the cured optical coating increases as the degree of unsaturation decreases. Suitable hydrocarbons include hydroxyl-terminated, fully hydrogenated 1,2-polybutadiene or polyisobutylene. Hydrogenated 1,2-polybutadiene is preferred due to its superior resistance to yellowing when cured. It is commercially available from Nippon Soda, Ltd. under the trademark GI-1000.

2. The Diisocyanate

The choice of diisocyanate has an effect upon the flexibility and optical clarity of the cured optical coating. Non-aromatic diisocyanates from six to twenty carbon atoms may be employed in the preparation of the isocyanate-terminated precursor. Aromatic diisocyanates are unacceptable due to their tendency to cause yellowing of the cured optical coating. Suitable saturated, aliphatic diisocyanates include dicyclohexylmethane-4,4'-diisocyanate, isophorone diisocyanate, hexamethylene diisocyanate and trimethylhexamethylene diisocyanate. Isphorone diisocyanate is preferred because it provides superior surface hardness in the cured acrylic film.

The reaction between the hydroxyl-terminated hydrocarbon and the diisocyanate generally requires a small amount of catalyst, typically from 100 to 200 ppm. Suitable catalysts include dibutyltin oxide, dibutyltin dilaurate, stannous oleate, stannous octoate, and lead octoate. Tertiary amines such as triethylamine, diethylmethylamine, triethylene diamine, dimethylethylamine, morpholine, N-ethyl morpholine, and piperazine may also be employed. Dibutyltin dilaurate is preferred because of its high reactivity.

3. The Acrylation Agent

The acrylation agent is a hydroxyl-terminated aliphatic acrylate or methacrylate which must conform to the formula

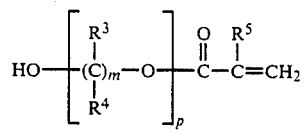

wherein $R^3$, $R^4$, and $R^5$ are independently selected from the group consisting of hydrogen, methyl, ethyl, or propyl, m is an integer from 1 to 10, and p is zero or one.

The choice of acrylation agent affects the degree of crosslinking of the cured optical coating. The choice of acrylation agent also affects the cure rate of the acrylate-terminated oligomer. Suitable hydroxyl-terminated monoacrylates include hydroxyethyl acrylate, hydroxyethyl methacrylate, hydroxypropyl acrylate, and hydroxypropyl methacrylate. Hydroxyethyl acrylate is preferred because it imparts a faster cure rate to the polyurethane oligomer.

The acrylation agent should be added to the polyurethane precursor in the absence of light. To further minimize the possibility of premature gellation, one or more of the following precautions may be taken:

1. Maintaining the reaction temperature at or below 65° C.
2. Adding 30 to 100 ppm of an acrylate stabilizer such as phenothiazine, hydroquinone or methyl ether of hydroquinone.
3. Adding 15 to 20 weight percent of a reactive diluent to lower the reaction mixture viscosity, thereby permitting more efficient heat transfer. Suitable reactive diluents include lauryl acrylate and 2-ethylhexyl acrylate.
4. Running the reaction under dried air.

B. THE REACTIVE DILUENT

The oligomer formed by the acrylation of the isocyanate-terminated precursor is a typically high viscosity liquid. A low molecular weight acrylic monomer is added as a reactive diluent to lower the viscosity of the oligomer. Important considerations governing the selection of the reactive diluent include toxicity, volatility, effect on the optical clarity of the cured optical coating, and cost. Acceptable reactive diluents include lauryl acrylate, lauryl methacrylate, stearyl acrylate, stearyl methacrylate, hexanediol diacrylate, trimethylolpropane triacrylate, neopentyl glycol diacrylate, and ethylhexylacrylate. Lauryl acrylate is preferred because it imparts superior flexibility to the cured optical coating. Ethylhexylacrylate is preferred due to its low cost.

Diacrylates or triacrylates may be employed as the reactive diluent to impart enhanced surface hardness and adhesion to the cured optical coating composition. The cure speed of the optical coating composition is usually more rapid, and the cured film harder, when diacrylates or triacrylates are employed as the reactive diluent.

A mixture of acrylic monomers is preferred as the reactive diluent to achieve the optimum balance of flexibility and mar resistance in the cured optical coating while achieving the desired viscosity in the uncured optical coating composition at the lowest cost and toxicity. A reactive diluent comprising a mixture of ethylhexylacrylate and hexanediol diacrylate, illustrated in Example III, is preferred.

C. THE PHOTOINITIATOR

The selection of photoinitiator is critical. It must provide reasonable curing speed without causing premature gellation of the optical coating composition. It must not affect the optical clarity of the cured optical coating. Only four pootoinitiators—alpha-hydroxycyclohexylphenyl ketone diethoxyacetophenone, 1-(4-dodecylphenyl)-2-hydroxy-2-methylpropan-1-one, and 2-hydroxy-2-methyl-1-phenylpropan-1-one - are acceptable for use as the photoinitiator. Alpha-hydoxycyclohexylphenyl ketone is commercially available from Ciba-Geigy Corp., Dyestuffs and Chemicals Division Greensboro, N.C. 27409 under the tradename CGI-184. 2-hydroxy-2-methyl-1-phenyl-propan-1-one is commercially available from EM Chemicals Corporation, 500 Executive Blvd., Elmsford, N.Y. 10523, under the tradename DAROCUR 1173. 1-(4-dodecylphenyl)-2-hydroxy-2-methylpropan-1-one is commercially available from EM Chemicals Corporation under the tradename DAROCUR 953. Diethoxyacetophenone is commercially available from the UpJohn Company, Fine Chemicals Division, North Haven, Conn. 06473.

Cure of the optical coating composition is achieved by depositing the coating composition onto a clear plastic support and passing the supported coating composition under an ultraviolet or ionizing (electron beam) radiation source. The coated side of the support is exposed to the radiation for a time sufficient to initiate addition polymerization of the acrylate or methacrylate groups of the coating composition. The polymerization process is preferably performed under an inert atmosphere such as nitrogen. The resulting clear acrylic film bonded onto a clear plastic support is termed a "cured optical coating."

By "ultraviolet radiation" it is meant any radiation source which will emit ultraviolet radiation in wavelengths of from 2000 to 4000 angstroms in sufficient intensity to produce free radicals in the optical coating composition and thereby induce addition polymerization of olefinic bonds, typically from 0.0004 to 6.0 watts/cm$^2$. Suitable radiation sources include Type RS sunlamps, carbon arc lamps, xenon arc lamps, mercury vapor lamps, tungsten halide lamps, fluorescent lamps with ultraviolet light emitting phosphors, and lasers.

D. HOW TO USE

The cured acrylic film of the optical coating may be lenticulated by conventional processes. The clear plastic support of the lenticulated optical coating is then bonded to a conventional photoemulsion supported by backing material. The resulting laminate, consisting of the following layers—lenticulated acrylic film which is resistant to yellowing, clear plastic support, photoemulsion and backing material—is termed an "unexposed color print material."

Unexposed color print material may be developed by conventional photographic development processes, which typically comprise:
1. Projecting the image of a color print negative upon the surface of the color print material surface, thereby "exposing" the color print material;
2. Immersing the exposed color print material in a "developer" solution for a time sufficient to react the dyes and pigments in the color print photoemulsion, typically 4 minutes;
3. Immersing the exposed color print material in a "fixer" solution which stops further reaction of the color print material photoemulsion;
4. Immersing the exposed color print material in a water rinse for a time sufficient to remove all traces of the "developer" and "fixer" solutions, typically 4 minutes at 91° F.; and
5. Drying the developed color print material.

E. DESCRIPTION OF A PREFERRED EMBODIMENT

The applicants have achieved optimum results from an optical coating composition comprising
(i) approximately 59 percent, based upon total composition weight, of an oligomer prepared by reacting hydrogenated NISSO GI-1000 hydroxyl-terminated polybutadiene with isophorone diisocyanate, followed by endcapping with 2-hydroxyethyl acrylate,
(ii) approximately 29 percent, based upon total composition weight, of 1,6-hexanediol diacrylate, employed as a reactive diluent,
(iii) approximately 10 percent, based upon total composition weight, of 2-ethylhexylacrylate, also employed as a reactive diluent,
(iv) approximately 2 percent, based upon total composition weight, of alpha-hydroxycyclohexylphenyl ketone, employed as a photoinitiator.

The preparation of this composition is illustrated by Example III below.

EXAMPLES

The Examples which follow are intended to illustrate the practice and advantages of the applicants' invention, and are not intended to limit the scope of their invention in any way. All concentration percentages are measured by total weight of the composition unless otherwise stated.

EXAMPLE I 50 grams (0.45 equivalents) of isophorone diisocyanate were added to a reactor vessel equipped with an agitator, a thermometer, an inert gas inlet and a charging port. The reaction vessel was continuously purged with dry air throughout the oligomer preparation. The isophorone diisocyanate was heated to 65° C. and agitated. 0.04 grams of dibutyltin dilaurate were added. 178 grams (0.225 equivalents based on an equivalent weight of 791) of Exxon hydroxyl-terminated, hydrogenated polyisobutylene (molecular weight of 1582) were added.

When the theoretical isocyanate content (0.225 equivalents) was reached, the temperature was raised to 75° C. Over the course of 40 minutes, 26.43 grams (0.225 equivalents) of 2-hydroxyethyl acrylate were added to the reaction mixture. The reaction required approximately three hours to proceed to completion (final isocyanate concentration less than 0.2%) at a final temperature maintained about 75°–80° C.

54.5 grams of 2-ethylhexylacrylate and 3.6 grams of alpha-hydroxycyclohexylphenyl ketone were added to 127.2 grams of the oligomer, which was then mixed thoroughly to produce a clear, viscous, optical coating composition, which was labelled IA.

54.5 grams of lauryl acrylate and 3.6 grams of alpha-hydroxycyclohexylphenyl ketone were added to the remaining 127.2 grams of oligomer, and mixed thoroughly. The clear, viscous optical coating composition so prepared was labelled IB.

EXAMPLE II

Using the procedure of Example I, 111.7 grams (0.14 equivalents, based upon an equivalent of 782 grams/equivalent) of hydrogenated NISSO GI-1000 hydroxyl-terminated polybutadiene (approximately 1564 molecular weight) were added to 30 grams (0.28 equivalents) of trimethylhexamethylene diisocyanate, in the presence of 0.03 grams of dibutyltin dilaurate to form the isocyanate-terminated precursor.

16.6 grams (0.14 equivalents) of 2-hydroxyethyl acrylate were added to form the acrylate terminated oligomer.

71.95 grams of the oligomer were mixed with 71.95 grams of 1,6-hexanediol diacrylate and 2.9 grams of 2-hydroxycyclohexylphenone to form a clear optical coating composition, which was labelled IIA.

The remaining 86.4 grams of the oligomer were mixed with 28.8 grams of 1,6-hexanediol diacrylate, 28.8 grams of ethylhexylacrylate, and 2.9 grams of alpha-hydroxycyclohexylphenyl ketone to from a clear optical coating composition which was labelled IIB.

EXAMPLE III

Using the procedure of Example I, 106 grams (0.135 equivalents, based upon an equivalent weight of 782 grams/equivalent) of hydrogenated NISSO GI-1000 hydroxyl-terminated polybutadiene were added to 30 grams (0.27 equivalents) of isophorone diisocyanate in the presence of a small amount of dibutyltin dilaurate to form the isocyanate-terminated precursor.

15.7 grams (0.135 equivalents) of 2-hydroxyethyl acrylate were added to form the acrylate-terminated oligomer.

75.9 grams of 1,6-hexanediol diacrylate, 25.3 grams of ethylhexyl acrylate, and 5.1 grams of alpha-hydroxycyclohexylphenyl ketone were added to the oligomer, which was then mixed thoroughly to produce a clear optical coating composition labelled III.

EXAMPLE IV

Using the procedure of Example I, 167.5 grams (0.225 equivalents, based upon a 744 equivalent weight) of unsaturated NISSO G-1000 hydroxyl-terminated polybutadiene were added to 50 grams (0.45 equivalents) of isophorone diisocyanate in the presence of a small amount of dibutyltin dilaurate to form the isocyanate-terminated precursor.

26.1 grams (0.225 equivalents) of 2-hydroxyethyl acrylate were added to form the acrylate-terminated oligomer.

40.6 grams of 1,6-hexanediol diacrylate, 121.8 grams of ethylhexyl acrylate, and 8.12 grams of alpha-hydroxycyclohexylphenyl ketone were added to the oligomer, which was then mixed thoroughly to produce a clear optical coating composition which was labelled IV.

EXAMPLE V

Using the procedure of Example I, 154 grams (0.135 equivalents, based upon an equivalent weight of 1141 grams/equivalent) of hydrogenated NISSO GI-2000 hydroxyl-terminated polybutadiene (approximate molecular weight of 2282) were added to 30 grams (0.27 equivalents) of isophorone diisocyanate in the presence of 0.04 grams of dibutyltin dilaurate to form the isocyanate-terminated precursor.

15.7 grams (0.135 equivalents) of 2-hydroxyethyl acrylate were added to form the acrylate-terminated oligomer.

93.19 grams of the oligomer were mixed with 26.63 grams of 1,6-hexanediol diacrylate, 13.31 grams of ethylhexyl acrylate, and 2.66 grams of alpha-hydroxycyclohexylphenyl ketone to produce a clear optical coating composition labelled VA.

The remaining 106.5 grams of oligomer were mixed with 13.31 grams of trimethylolpropane triacrylate, 13.31 grams of ethylhexyl acrylate, and 2.66 grams of 2-hydroxycyclohexylphenone to produce a clear optical coating composition labelled VB.

EXAMPLE VI

Using the procedure of Example I, 150.5 grams (0.19 equivalents, based upon an equivalent weight of 777 grams/equivalent) of hydrogenated NISSO GI-1000 hydroxyl-terminated polybutadiene were added to 50 grams (0.38 equivalents) of dicyclohexylmethane-4,4'-diisocyanate in the presence of 0.04 grams of dibutyltin dilaurate to form the isocyanate-terminated precursor.

22.5 grams (0.19 equivalents) of 2-hydroxyethyl acrylate were added to form the acrylate-terminated oligomer.

31.86 grams of trimethylolpropane triacrylate, 63.71 grams of ethylhexyl acrylate, and 6.37 grams of alpha-hydroxycyclohexylphenyl ketone were added to the oligomer, which was then thoroughly mixed to produce a clear optical coating composition labelled VI.

EXAMPLE VII

Portions of the optical coating composition of Example III were evaluated for various physico-chemical properties. Results of these tests are listed in TABLE I below:

TABLE I

| | |
|---|---|
| Viscosity @ 25 @ C | 1200–1400 cps |
| Refractive Index | 1.470–1.475 |
| Specific Gravity | 1.01 |
| Unsaturation | 0.36 |
| Isocyanate Content | <0.2 |
| Base No. | <10.0 |
| Acid No. | <0.5 |

Portions of the optical coating composition of Example III were cast as films and cured by exposure to ultraviolet radiation. These films were then evaluated for tensile strength and elongation. Results of these tests are listed in TABLE II below:

TABLE II

| | |
|---|---|
| Tensile Strength | 1000–1200 psi |
| Elongation | 15–20% |
| Tear Strength | 20–30 lb/inch |

"Mar Resistance" is a measure of the surface hardness and surface lubricity ("slip") of the cured optical coating. A cured optical coating passes this test if a fingernail drawn across its surface does not leave any scratches.

"Flexibility" is determined by manually bending a sheet of cured optical coating in half (180°) and observing whether any cracks appear in the cured optical coating. A "Good" rating means no cracks appeared.

An "Acceptable" rating means no cracks appeared, but the optical coating was harder to bend than optical coatings which were rated "good".

The "Sun Light" exposure test consists of exposing a cured optical coating to sun light for a minimum of four hours.

The "Sun Lamp" exposure test consists of exposing a cured optical coating to a 275 watt Sylvania sun lamp for a minimum of twelve hours at a distance of one foot.

The "Fluorescent Lamp" exposure test consists of exposing a cured optical coating to fluorescent light for a minimum of twelve hours at a distance of one foot.

The "Incandescent Lamp" exposure test consists of exposing the surface of a cured optical coating to a 100 watt incandescent lamp for a minimum of twelve hours at a distance of one foot.

The "140° F. Oven" exposure test consists of placing the samples in an oven maintained at 140° F. for a minimum of eighteen hours.

EXAMPLE VIII

The compositions of Examples I through VI were deposited as films upon clear plastic supports (approximately six inches square), and cured by exposure to ultraviolet radiation. The cured optical coatings so prepared were immersed in a photographic "developer" solution for approximately four minutes, immersed in a "fixer" solution for 1.5 minutes, immersed in a water rinse for approximately three minutes, and dried.

Some of the samples were then tested for mar resistance and flexibility while others were subjected to various accelerated aging exposure tests to determine resistance of the cured optical coatings to yellowing. Results of these tests are set out in TABLE III below:

TABLE III

| Optical Coating | Physical Testing | | | Degree of Yellowing After Accelerated Aging | | | | |
|---|---|---|---|---|---|---|---|---|
| | Processing Rinse | Mar Resistance | Flexibility | 140° F. Oven | Sun Light | Sun Lamp | Fluorescent Lamp | Incandescent Lamp |
| I (A) | Water | Acceptable | Good | None | None | None | None | None |
| I (B) | Water | Acceptable | Good | None | None | None | None | None |
| II (A) | Water | Good | Acceptable | None | None | None | None | None |
| II (B) | Water | Acceptable | Good | None | None | None | None | None |
| III | Water | Excellent | Slightly Brittle | None | None | None | None | None |
| IV | Water | Good | Acceptable* | None | None | None | None | None |
| V (A) | Water | Good | Good | None | None | None | None | None |
| V (B) | Water | Good | Good | None | None | None | None | None |
| VI | Water | Good | Good | None | None | None | None | None |

*Upon accelerated aging under sunlamp, this formulation becomes brittle. The substantially hydrogenated compositions do not display this brittleness.

EXAMPLE IX

The oligomer and reactive diluent of Example III were mixed with the four permissible photoinitiators to produce the four optical coating compositions set out in TABLE IV below:

TABLE IV

| Component | Composition Percentage | | | |
|---|---|---|---|---|
| | A | B | C | D |
| oligomer | 58.7 | 58.7 | 58.7 | 58.7 |
| reactive diluent | | | | |
| hexanediol diacrylate | 29.5 | 29.5 | 29.5 | 29.5 |
| ethylhexyl acrylate | 9.8 | 9.8 | 9.8 | 9.8 |
| photoinitiator | | | | |
| alpha-hydroxycyclohexyl-phenyl ketone | 2.0 | | | |
| diethoxyacetophenone | | 2.0 | | |
| 2-hydroxy-2-methyl-1-phenyl-propan-1-one | | | 2.0 | |
| 1-(4-dodecylphenyl)-2-hydroxy-2-methylpropan-1-one | | | | 2.0 |
| | 100% | 100% | 100% | 100% |

The four compositions described above were deposited as films upon clear plastic supports (approximately six inches square) and cured by exposure to ultraviolet radiation. The cured optical coatings so prepared were immersed in a photographic developer solution for approximately four minutes, immersed in a fixer solution for approximately three minutes, immersed in a water rinse for approximately three minutes, and dried. The samples were then tested for yellowing resistance by exposure to various accelerated aging exposure tests. Results of these tests are set out in TABLE V below:

TABLE V

| Optical Coating | Physical Testing | | Degree of Yellowing After Accelerating Aging | | | | |
|---|---|---|---|---|---|---|---|
| | Mar Resistance | Flexibility | 140° F. Oven | Sun Lamp | Sun Lamp | Fluorescent Lamp | Incandescent Lamp |
| IXA | Excellent | Slightly brittle | None | None | None | None | None |
| IXB | Excellent | Slightly brittle | None | None | None | None | None |
| IXC | Excellent | Slightly brittle | None | None | None | None | None |
| IXD | Excellent | Slightly brittle | None | None | None | None | None |

We claim:

1. Unexposed photographic color print material comprising a laminate of a photoemulsion layer having front and back sides and an optically clear coating layer having front and back sides, wherein:

A. said photoemulsion layer is adapted to be exposed to the image of a color print negative projected through said coating layer, developed by an immersion development process, and viewed through said coating layer following said development process;

B. the front side of said coating layer is the front outside surface of said color print material, and is adapted to be in contact with immersion development process chemicals during develpment of said print material;

C. the back side of said coating layer faces the front side of said photoemulsion layer;

D. said coating layer has the property of being essentially non-yellowing during and after immersion of said color print material in immersion development process chemicals with said coating layer in direct contact with said chemicals; and E. said coating layer consists essentially of the cured reaction product of:

(i) from 45 to 80 percent, based upon total weight of the composition, of an oligomer of the formula:

where $R^1$ is a linear or branched hydrocarbon polymer of from 1,000 to 4,000 molecular weight selected from the group consisting of fully hydrogenated 1,2-polybutadiene; 1,2-polybutadiene hydrogenated to an iodine number of from 9 to 21; and fully hydrogenated polyisobutylene;

$R^2$ is a linear, branched or cyclic alkylene of from six to twenty carbon atoms; and X and Q are independently either (a) a radical of the formula:

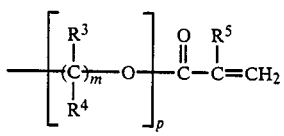

wherein $R^3$, $R^4$, and $R^5$ are independently hydrogen or methyl, m is an integer from 1 to 10, and p is either zero or one, or (b) a saturated alkyl radical of from nine to twenty carbon atoms, with the proviso that said oligomer must possess at least one acrylate or methacrylate terminal group;

(ii) from 20 to 50 percent, based on total weight of the composition, of an acrylate or methacrylate terminated reactive diluent of from 11 to 22 carbon atoms; and (iii) from 0.5 to 5 percent, based upon the total weight of the composition, of a photoinitiator selected from the goup consisting of alpha-hydroxycyclohexylphenyl ketone, diethoxyacetophenone, 1-(4-dodecylphenyl)-2-hydroxy-2-methyl-propan-1-one, 2-hydroxy-2-methyl-1-phenyl-propan-1-one, and mixtures thereof;

wherein $R^1$ and $R^2$ are free of aromatic, ether, or ester functional groups.

2. The article of manufacture of claim 1, wherein said reactive diluent comprises a mixture of at least two acrylate-terminated compounds of from 11 to 22 carbon atoms.

3. The article of manufacture of claim 1, wherein said reactive diluent is selected from the group consisting of lauryl acrylate, lauryl methacrylate, stearyl acrylate, stearyl methacrylate, ethylhexyl acrlate, isodecyl acrylate, hexanediol diacrylate, neopentyl glycol diacrylate, trimethylolpropane triacrylate, and mixtures thereof.

4. The article of manufacture of claim 1, wherein said reactive diluent is a mixture of ethylhexylacrylate and hexanediol diacrylate.

5. The article of manufacture of claim 1, wherein $R^1$ consists essentially of hydrogenated 1,2-polybutadiene.

* * * * *